United States Patent
Ganguly et al.

(10) Patent No.: US 8,748,259 B2
(45) Date of Patent: Jun. 10, 2014

(54) METHOD AND APPARATUS FOR SINGLE STEP SELECTIVE NITRIDATION

(75) Inventors: Udayan Ganguly, Mambai (IN); Theresa Kramer Guarini, San Jose, CA (US); Matthew Scott Rogers, Mountain View, CA (US); Yoshitaka Yokota, San Jose, CA (US); Johanes S. Swenberg, Los Gatos, CA (US); Malcolm J. Bevan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 13/033,330

(22) Filed: Feb. 23, 2011

(65) Prior Publication Data
US 2011/0217834 A1    Sep. 8, 2011

Related U.S. Application Data

(60) Provisional application No. 61/309,744, filed on Mar. 2, 2010.

(51) Int. Cl.
   *H01L 21/00*    (2006.01)
(52) U.S. Cl.
   USPC ............ 438/257; 438/776; 438/777; 438/792
(58) Field of Classification Search
   CPC ................. H01L 21/28202; H01L 21/28273; H01L 21/0217; H01L 21/02252; H01L 21/28282
   USPC .................. 438/257–267, 775–777, 791–794
   See application file for complete search history.

(56) References Cited

U.S. PATENT DOCUMENTS

| 6,800,830 | B2 * | 10/2004 | Mahawili ................. 219/121.41 |
| 6,960,502 | B2 * | 11/2005 | Yamaguchi .................. 438/216 |
| 7,759,260 | B2 | 7/2010 | Burnham et al. |
| 2004/0063284 | A1 * | 4/2004 | Kaya et al. ..................... 438/261 |
| 2008/0176413 | A1 | 7/2008 | Sasaki |
| 2009/0294829 | A1 | 12/2009 | Morikado |

OTHER PUBLICATIONS

International Search Report dated Jan. 9, 2012, for International Application No. PCT/US2011/026423.

* cited by examiner

*Primary Examiner* — Richard Booth
(74) *Attorney, Agent, or Firm* — Patterson & Sheridan, LLP

(57) ABSTRACT

Methods and apparatus for selective one-step nitridation of semiconductor substrates is provided. Nitrogen is selectively incorporated in silicon regions of a semiconductor substrate having silicon regions and silicon oxide regions by use of a selective nitridation process. Nitrogen containing radicals may be directed toward the substrate by forming a nitrogen containing plasma and filtering or removing ions from the plasma, or a thermal nitridation process using selective precursors may be performed. A remote plasma generator may be coupled to a processing chamber, optionally including one or more ion filters, showerheads, and radical distributors, or an in situ plasma may be generated and one or more ion filters or shields disposed in the chamber between the plasma generation zone and the substrate support.

19 Claims, 1 Drawing Sheet

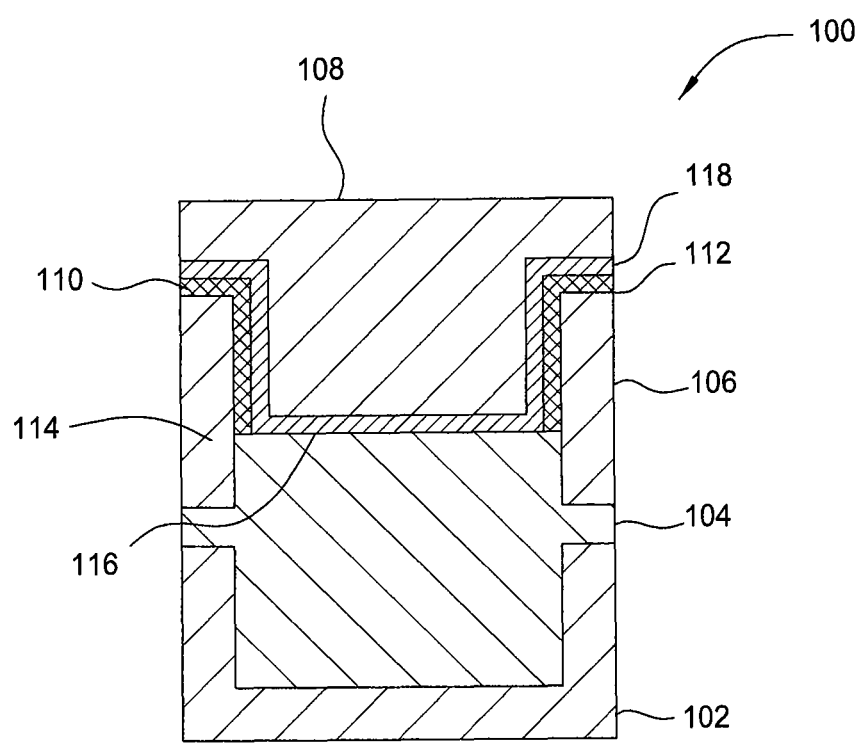

METHOD AND APPARATUS FOR SINGLE STEP SELECTIVE NITRIDATION

CROSS-REFERENCE TO RELATED APPLICATIONS

This application claims benefit of U.S. Provisional Patent Application Ser. No. 61/309,744, filed Mar. 2, 2010, which is incorporated herein by reference.

FIELD

Embodiments described herein relate to manufacturing semiconductor devices. More specifically, embodiments described herein relate to manufacture of floating gate NAND memory devices and other transistor gate structures.

BACKGROUND

As logic devices continue to scale down according to Moore's Law, processing challenges develop. One such challenge arises in floating gate (FG) NAND flash memory chips, which feature transistors that incorporate two gate elements, a control gate and a floating gate, to enable each transistor to assume more than one bit value. FG NAND memory forms the basis of most USB flash memory devices and memory card formats used today.

As critical dimensions of FG NAND devices shrink, the geometry of the various components becomes more challenging for manufacturers. Aspect ratios rise and uniformity, tolerance, and reliability issues proliferate. With NAND flash memory increasing in popularity as a convenient storage medium, there is a need for improved manufacturing processes to overcome scaling challenges particular to NAND flash devices.

SUMMARY

Embodiments described herein provide methods of processing a semiconductor device by generating a nitrogen containing plasma, exposing a surface of a substrate containing silicon regions and silicon oxide regions to the nitrogen containing plasma, and selectively incorporating nitrogen into the silicon regions of the substrate.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic cross-sectional diagram of a floating gate NAND flash memory device according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

FIG. 1 is a schematic cross-sectional diagram of a FG NAND flash memory device 100 according to one embodiment. The device 100 has a semiconductor element region 102, an isolation region 104, a floating gate 106, and a control gate 108. The floating gate 106 has a first dielectric layer 110 formed on a field surface 112 and sidewall surface 114 thereof, and a second dielectric layer 118 formed on the first dielectric layer 110. The isolation region 104 is typically a dielectric material. In one embodiment, the floating gate 106 comprises polysilicon. In another embodiment, the isolation region 104 comprises silicon oxide.

The first dielectric layer 110 formed on the field surface 112 and sidewall surface 114 of the floating gate 106 may be a nitride layer such as silicon nitride or silicon oxynitride. The second dielectric layer 118 may be an oxide-nitride-oxide layer. In one embodiment, the nitride layer may be formed by exposing the field surface 112 and sidewall surface 114 of the floating gate 106, and a top surface 116 of the isolation region 104, to a selective plasma nitridation process. A selective plasma nitridation process generally forms nitrides of silicon faster than nitrides of silicon oxide.

In one embodiment, the selective plasma nitridation process comprises forming nitrogen containing radicals and exposing the silicon and silicon oxide surfaces described above to the nitrogen containing radicals. The nitrogen containing radicals react preferentially with silicon due to lower Si—Si bond energies (326 kJ/mol versus 799 kJ/mol for Si—O bonds) to selectively form Si—N bonds. Radicals are preferred because ions have high chemical activity compared to radicals and compared to the bond energies listed above ($1^{st}$ ionization energy of $N_2$=1402 kJ/mol; atomization energy of $N_2$=473 kJ/mol), so ions do not achieve the selectivity of radicals. Selectivity, defined as concentration of nitrogen in silicon divided by concentration of nitrogen in oxide after a given deposition process, may be between about 10:1 and about 100:1, such as between about 20:1 and about 70:1, for example about 40:1. Greater exposure time improves the selectivity.

Nitrogen containing radicals, such as N, NH, and $NH_2$, may be preferentially generated by a number of methods. High radical density versus ion density may be achieved by a high pressure plasma process using, for example, pressure above about 5 Torr. The high pressure encourages ions to recombine with electrons quickly, leaving neutral radical species and inactive species. In some embodiments, a radical gas is formed. In some embodiments, remote plasma may be used to selectively generate radical species by various methods. The remote plasma generator, for example a microwave, RF, or thermal chamber, may be connected to a processing chamber by a relatively long pathway to encourage ionic species to recombine along the pathway before reaching the chamber. The radicals may flow into the chamber through a showerhead or radical distributor in some embodiments, or through a portal entry in a side wall of the chamber at a flow rate between about 1 sLm and about 20 sLm, such as between about 5 sLm and about 20 sLm, for example about 10 sLm. Nitrogen radicals may be formed in one embodiment by exposing a nitrogen containing gas, such as nitrogen, ammonia, or a mixture thereof, optionally with a' carrier gas such as helium, to microwave power between about 1-3 kW at a pressure above about 5 Torr. The nitrogen radicals may be flowed into a processing chamber operating at a pressure between about 1 Torr and about 5 Torr to process a substrate.

In other embodiments, various ion filters may be used, such as electrostatic filters operated at a bias of, for example, about 200V (RF or DC), wire or mesh filters, or magnetic filters, any of which may have a dielectric coating. In other embodiments, residence time in the remote plasma generator may be modulated using gas flow of reactive species such as nitrogen containing species or gas flow of non-reactive species such as argon or helium. In some embodiments, radical half-life may be extended by using an ion filter with low pressure plasma generation. Low pressure operation may be facilitated by integrating a processing chamber with a remote plasma chamber without using an o-ring to seal the pathway between the two chambers. Uniformity of radical flow into a processing chamber from remote plasma generation chamber may be improved using a shaped connector to provide intimate control of flow patterns.

Remotely generated nitrogen containing radicals may be provided to a chamber having a rotating substrate support through a portal adjacent to the substrate support such that the nitrogen radicals flow across a substrate disposed on the substrate support. Rotating the substrate support ensures uniform exposure of the substrate to the nitrogen containing radicals. Heating the substrate increases solubility of the nitrogen radicals in the solid substrate material, encouraging the nitrogen containing radicals to penetrate the substrate surface to a depth between about 20 Å and about 100 Å, such as between about 25 Å and about 50 Å, for example about 35 Å. In an embodiment wherein a substrate having a surface with silicon regions and silicon dioxide regions is exposed to a method described herein, the nitrogen dose obtained in the silicon regions is typically between about $5 \times 10^{15}$ atoms/cm$^2$ and about $25 \times 10^{15}$ atoms/cm$^2$, such as between about $10 \times 10^{15}$ atoms/cm$^2$ and about $20 \times 10^{15}$ atoms/cm$^2$, for example about $15 \times 10^{15}$ atoms/cm$^2$.

In many embodiments, the nitridation process is performed at a substrate temperature between about 300° C. and about 1200° C., for example between about 800° C. and about 1000° C., which may be increased as the nitridation proceeds to combat surface saturation. As nitridation proceeds and the concentration of nitrogen in the substrate increases, surface deposition of nitrogen becomes more favored. Surface deposition tends to block sites for potential penetration of nitrogen into the surface. Increasing the temperature of the substrate volatilizes surface deposited species, re-exposing those sites to nitridation. Thus, temperature of the substrate may be increased while the substrate is exposed to nitrogen radicals to volatilize surface deposited nitrogen and increase penetration of nitrogen into the substrate.

Additionally, multi-step nitridation processes may be performed, with a first step, for example, performed at a low temperature of about 400° C. to form a first nitride region and a second step performed at a higher temperature of about 800° C. or higher to form a second nitride region that may encompass the first nitride region, or may lie above or below the first nitride region assuming suitable orientation of the subject device. The first nitride region formed at the lower temperature may act as a diffusion barrier to prevent loss of dopants from the substrate at higher temperatures. Heating may be performed using lamp heating, laser heating, use of a heated substrate support, or by plasma heating.

Nitridation may be performed by thermal means alone, by plasma means alone, or by a combination of the two. Selective thermal nitridation may be performed using ammonia ($NH_3$) as the nitrogen containing species. Radical nitridation may be performed using any relatively low molecular weight nitrogen containing species. Suitable precursors for radical nitridation include, but are not limited to, nitrogen ($N_2$), ammonia ($NH_3$), hydrazine ($N_2H_4$), lower substituted hydrazines ($N_2R_2$, wherein each R is independently hydrogen, a methyl, ethyl, propyl, vinyl, or propenyl group), and lower amines ($NR_aH_b$, wherein a and b are each integers from 0 to 3 and a+b=3, and each R is independently hydrogen, a methyl, ethyl, propyl, vinyl, or propenyl group), amides (RCONR'R", wherein R, R', and R" are each independently hydrogen, a methyl, ethyl, propyl, vinyl, or propenyl group), imines (RR'C=NR", wherein R, R', and R" are each independently hydrogen, a methyl, ethyl, propyl, vinyl, or propenyl group), or imides (RCONR'COR", wherein R, R', and R" are each independently hydrogen, a methyl, ethyl, propyl, vinyl, or propenyl group).

In some embodiments, an in situ plasma generation process may be used, energized for example by microwave, UV, RF, or electron synchrotron radiation, with an ion filter, such as any of the ion filters described above, or an ion shield, such as a mesh or perforated plate, disposed between the gas distributor and the substrate support in the chamber. In one embodiment, a showerhead with ion filter capability (e.g. electrically isolated or with controlled electric potential) may be disposed between a plasma generation zone and the substrate processing zone to allow radicals to enter the substrate processing zone while filtering ions.

Heat may be applied to the substrate by any convenient means, such as a heat lamp or lamp array positioned above or below the substrate, a resistive heater embedded in the substrate support, or a laser based heating apparatus. Some embodiments of a selective nitridation process may be performed using an RPN chamber available from Applied Materials, Inc., located in Santa Clara, Calif. In such a chamber, heat is applied to the substrate from below using a bank of heat lamps while the substrate is rotated to enhance uniformity of processing.

Although the methods disclosed herein are described in context of forming floating gate NAND flash devices, application of the methods is not limited to such devices. The methods disclosed herein may be used to add nitrogen to other gate structures, such as hafnium oxide ($HfO_x$) and hafnium silicate ($HfSi_xO_y$), as well. Additionally, process conditions described herein may be used to process 300 mm While the foregoing is directed to embodiments of the invention, other and further embodiments of the invention may be devised without departing from the basic scope thereof.

What is claimed is:

1. A method of processing a semiconductor substrate, the semiconductor substrate having a surface with silicon regions and silicon oxide regions, the method comprising:
   disposing the substrate in a processing chamber;
   providing a gas mixture comprising nitrogen containing radicals;
   removing ions from the gas mixture prior to providing the gas mixture to the processing chamber;
   exposing the substrate to the gas mixture in the processing chamber; and
   selectively incorporating nitrogen in the silicon regions of the substrate, comprising:
      forming a first nitride region at a low temperature of about 400° C.; and then
      forming a second nitride region at a high temperature of about 800° C. or higher.

2. The method of claim 1, wherein the providing a gas mixture comprising nitrogen containing radicals to the processing chamber comprises forming a plasma from a nitrogen containing gas at a pressure of at least 5 Torr.

3. The method of claim 1, wherein the providing a gas mixture comprising nitrogen containing radicals to the processing chamber comprises forming a plasma from a nitrogen containing gas and filtering ions from the plasma.

4. The method of claim 1, wherein the providing a gas mixture comprising nitrogen containing radicals to the processing chamber comprises forming an in-situ plasma from a nitrogen containing gas and filtering ions from the plasma using an ion shield.

5. The method of claim 1, wherein the first nitride region forms a diffusion barrier in a surface of the substrate.

6. The method of claim 1, further comprising increasing a temperature of the substrate while the substrate is exposed to the gas mixture.

7. A method of selectively nitriding a substrate having semiconductive and dielectric regions, comprising:
   forming a radical gas from a nitrogen containing precursor gas;
   removing ions from the radical gas; and
   exposing the substrate to the radical gas at a temperature between about 300° C. and about 1,200° C. to incorporate nitrogen in the semiconductive region, comprising:
      forming a nitride diffusion barrier region in the substrate surface; and then
      forming a nitride region, wherein the nitride region encompasses at least a portion of the nitride diffusion barrier region.

8. The method of claim 7, wherein the forming the radical gas comprises applying microwave power to the nitrogen containing precursor gas in a remote chamber.

9. The method of claim 7, wherein exposing the substrate to the radical gas comprises flowing the radical gas across the substrate surface while rotating the substrate.

10. The method of claim 7, wherein the nitrogen containing precursor gas comprises nitrogen gas, ammonia, or a combination thereof.

11. The method of claim 10, wherein forming the radical gas comprises applying microwave power to the nitrogen containing precursor gas.

12. The method of claim 11, wherein the nitrogen containing precursor gas further comprises helium.

13. A method of forming a floating gate NAND flash device in a processing chamber, comprising:
   forming a silicon oxide isolation structure on a silicon substrate;
   forming a predominantly silicon floating gate on the isolation structure;
   providing a nitrogen containing precursor gas;
   removing ions from the nitrogen containing precursor gas prior to providing the nitrogen containing precursor gas to the processing chamber;
   selectively adding nitrogen radicals to the floating gate by forming a first nitride layer over the floating gate at a low temperature of about 400° C. and then forming a second nitride layer over the floating gate at a high temperature of about 800° C. or higher;
   forming a dielectric layer over the nitride layer and the isolation structure; and
   forming a control gate over the dielectric layer.

14. The method of claim 13, wherein the floating gate is polysilicon, and selectively adding nitrogen radicals to the floating gate comprises flowing nitrogen radicals into the processing chamber containing the substrate and heating the substrate.

15. The method of claim 13, wherein selectively adding nitrogen radicals to the floating gate comprises providing nitrogen radicals having energy less than a silicon-oxygen bond energy.

16. The method of claim 13, wherein selectively adding nitrogen radicals to the floating gate comprises:
   exposing the nitrogen containing precursor gas to microwave or RF power to form an activated precursor gas;
   flowing the activated precursor gas into a processing chamber containing the substrate at a pressure of at least about 5 Torr;
   increasing solubility of the nitrogen radicals in the floating gate by heating the substrate; and
   rotating the substrate.

17. The method of claim 13, wherein selectively adding nitrogen radicals to the floating gate comprises increasing a temperature of the substrate while exposing the substrate to nitrogen radicals.

18. The method of claim 13, wherein the first nitride layer forms a diffusion barrier in a surface of the substrate.

19. The method of claim 7, wherein the nitride diffusion barrier region is formed at a low temperature of about 400° C. and the nitride region is formed at a high temperature of about 800° C. or higher.

* * * * *

UNITED STATES PATENT AND TRADEMARK OFFICE
CERTIFICATE OF CORRECTION

PATENT NO. : 8,748,259 B2  Page 1 of 1
APPLICATION NO. : 13/033330
DATED : June 10, 2014
INVENTOR(S) : Ganguly et al.

It is certified that error appears in the above-identified patent and that said Letters Patent is hereby corrected as shown below:

Title Page, Inventors (75):

Please delete "Mambai" and insert -- Mumbai -- therefor.

Signed and Sealed this
Thirtieth Day of September, 2014

Michelle K. Lee
*Deputy Director of the United States Patent and Trademark Office*